US011222567B2

United States Patent
Qian et al.

(10) Patent No.: US 11,222,567 B2
(45) Date of Patent: Jan. 11, 2022

(54) SHIFT REGISTER CIRCUIT, METHOD FOR DRIVING THE SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xianrui Qian, Beijing (CN); Zixuan Wang, Beijing (CN); Yuting Chen, Beijing (CN); Fei Li, Beijing (CN); Bo Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 475 days.

(21) Appl. No.: 16/334,938

(22) PCT Filed: Aug. 14, 2018

(86) PCT No.: PCT/CN2018/100402
§ 371 (c)(1),
(2) Date: Mar. 20, 2019

(87) PCT Pub. No.: WO2019/134367
PCT Pub. Date: Jul. 11, 2019

(65) Prior Publication Data
US 2021/0335176 A1    Oct. 28, 2021

(30) Foreign Application Priority Data
Jan. 3, 2018    (CN) .......................... 201810004714.8

(51) Int. Cl.
*G09G 3/20*    (2006.01)
*G11C 19/28*    (2006.01)
(52) U.S. Cl.
CPC ............... *G09G 3/20* (2013.01); *G11C 19/28* (2013.01); *G09G 2300/0426* (2013.01);
(Continued)
(58) Field of Classification Search
CPC ..... G09G 2300/0408; G09G 2320/043; G09G 3/3677; G09G 2310/0286; G09G 2310/08; G11C 19/184; G11C 19/28
See application file for complete search history.

(56) References Cited

U.S. PATENT DOCUMENTS

2009/0278785 A1*    11/2009    Chin-Cheng ........ G09G 3/3677
345/100
2015/0123826 A1    5/2015    Lee et al.
(Continued)

FOREIGN PATENT DOCUMENTS

CN    105551421 A    5/2016
CN    106023874 A    10/2016
(Continued)

OTHER PUBLICATIONS

International Search Report and Written Opinion for Application No. PCT/CN2018/100402, dated Nov. 14, 2018, 11 Pages.

*Primary Examiner* — Nelson M Rosario
(74) *Attorney, Agent, or Firm* — Brooks Kushman P.C.

(57) ABSTRACT

A shift register circuit includes a noise reduction sub-circuit and a pull-down node control sub-circuit. A control end of the noise reduction sub-circuit is connected to a pull-down node, the noise reduction sub-circuit is connected to a first voltage input end. The pull-down node control sub-circuit includes a first pull-down node control sub-circuit and a second pull-down node control sub-circuit. The second
(Continued)

pull-down node control sub-circuit controls the pull-down control node to be connected to a first clock signal input end when the first clock signal input end inputs a first level, the pull-down node to be connected to the first clock signal input end when a potential of the pull-down control node is at the first level, so that the potential of the pull-down node is at a first level and a noise reduction transistor included in the noise reduction sub-circuit is turned off.

17 Claims, 7 Drawing Sheets

(52) U.S. Cl.
CPC . *G09G 2300/08* (2013.01); *G09G 2310/0267* (2013.01); *G09G 2310/0286* (2013.01); *G09G 2310/08* (2013.01); *G09G 2330/08* (2013.01)

(56) References Cited

U.S. PATENT DOCUMENTS

| | | | |
|---|---|---|---|
| 2016/0343334 A1* | 11/2016 | Hao | ........................ G09G 3/20 |
| 2017/0061861 A1 | 3/2017 | Dun | |
| 2018/0144677 A1 | 5/2018 | Zhang et al. | |
| 2018/0277052 A1 | 9/2018 | Miao et al. | |

FOREIGN PATENT DOCUMENTS

| | | |
|---|---|---|
| CN | 106098011 A | 11/2016 |
| CN | 107331418 A | 11/2017 |
| CN | 108172165 A | 6/2018 |

\* cited by examiner

SHIFT REGISTER CIRCUIT, METHOD FOR DRIVING THE SAME, AND DISPLAY DEVICE

CROSS-REFERENCE TO RELATED APPLICATION APPLICATIONS

This application is the U.S. national phase of PCT Application No. PCT/CN2018/100402 filed on Aug. 14, 2018, which claims priority to Chinese Patent Application No. 201810004714.8 filed on Jan. 3, 2018, which are incorporated herein by reference in their entireties.

TECHNICAL FIELD

The present disclosure relates to the field of a display driving technology, in particular to a shift register circuit, a method for driving the same, and a display device.

BACKGROUND

A Gate Driver On Array (GOA) circuit on an array substrate has been widely studied and focused in the display industry in recent years due to its advantages such as low cost, a narrow bezel, and simple processing. In a GOA circuit of the related art, an input end of a shift register circuit in a first stage is connected to a start end, an input end of the shift register circuit in each stage is connected to a gate driving signal output end of the shift register circuit in a previous stage. When a gate driving signal is not stable, the unstable gate driving signal will be transmitted stage by stage, and an abnormal signal may be amplified, so that the gate driving signal provided by the GOA circuit is distorted and the display panel is operated abnormally. In the shift register circuit, a gate electrode of a noise reduction transistor is connected to a pull-down node, since a potential of the pull-down node is at a high level for most of time (when the noise reduction transistor is an n-type transistor), the noise reduction transistor is turned on for most time of the display period (except for an input phase and an output phase), thereby causing a severe drift of the threshold voltage of the noise reduction transistor and affecting the stability of the gate driving circuit.

SUMMARY

A shift register circuit includes a noise reduction sub-circuit and a pull-down node control sub-circuit. A control end of the noise reduction sub-circuit is connected to a pull-down node, the noise reduction sub-circuit is connected to a first voltage input end. The pull-down node control sub-circuit comprises a first pull-down node control sub-circuit and a second pull-down node control sub-circuit. The first pull-down node control sub-circuit is connected to a pull-down control node, the first pull-down node control sub-circuit is connected to the pull-down node, the first pull-down node control sub-circuit is connected to a pull-up node, and the first pull-down node control sub-circuit is connected to a first clock signal input end. The second pull-down node control sub-circuit is connected to the first clock signal input end, a second pull-down node control sub-circuit is connected to the pull-down control node, and a second pull-down node control sub-circuit is connected to the pull-down node; and the second pull-down node control sub-circuit is configured to control the pull-down control node to be connected to a first clock signal input end when the first clock signal input end inputs a first level, and control the pull-down node to be connected to the first clock signal input end when a potential of the pull-down control node is at the first level, so that the potential of the pull-down node is at a first level and a noise reduction transistor included in the noise reduction sub-circuit is turned off.

In some embodiments, the first pull-down node control sub-circuit is configured to control the potential of the pull-down control node and the potential of the pull-down node to be both at a second level when the first clock signal input end inputs a second level and the potential of the pull-up node is at a first level, to control the noise reduction transistor to be turned on; and the first pull-down node control sub-circuit is further configured to control the potential of the pull-down control node to be at the first level when the first clock signal input end inputs a second level and the potential of the pull-up node is at a second level; and the second pull-down node control sub-circuit is further configured to control to disconnect the pull-down node and the first clock signal input end when the potential of the pull-down control node is at a second level.

In some embodiments, the second pull-down node control sub-circuit comprises a first pull-down control sub-circuit and a second pull-down control sub-circuit; the first pull-down control sub-circuit is connected to the first clock signal input end, and the first pull-down control sub-circuit is connected to the pull-down control node, the first pull-down control sub-circuit is configured to control the pull-down control node to be connected to the first clock signal input end when the first clock signal input end inputs the first level; and the second pull-down control sub-circuit is connected to the pull-down control node, the second pull-down control sub-circuit is connected to the first clock signal input end, the second pull-down control sub-circuit is connected to the pull-down node, and the second pull-down control sub-circuit is configured to control the pull-down node to be connected to the first clock signal input end when the potential of the pull-down control node is at a first level.

In some embodiments, the first pull-down control sub-circuit comprises a first pull-down control transistor, a gate electrode of the first pull-down control transistor is connected to the first clock signal input end, a first electrode of the first pull-down control transistor is connected to the pull-down control node, and a second electrode of the first pull-down control transistor is connected to the first clock signal input end.

In some embodiments, transistors included in the first pull-down node control sub-circuit are all n-type transistors, and the first pull-down control transistor is a p-type transistor.

In some embodiments, transistors included in the first pull-down node control sub-circuit are all p-type transistors, and the first pull-down control transistor is an n-type transistor.

In some embodiments, the second pull-down control sub-circuit includes a second pull-down control transistor, a gate electrode of the second pull-down control transistor is connected to the pull-down control node, and a first electrode of the second pull-down control transistor is connected to the pull-down node, and a second electrode of the second pull-down control transistor is connected to the first clock signal input end.

In some embodiments, transistors included in the first pull-down node control sub-circuit are all n-type transistors, and the second pull-down control transistor is a p-type transistor.

In some embodiments, transistors included in the first pull-down node control sub-circuit are p-type transistors, and the second pull-down control transistor is an n-type transistor.

In some embodiments, the noise reduction sub-circuit is further connected to the pull-up node, the noise reduction sub-circuit is further connected to a gate driving signal output end, and the noise reduction sub-circuit is further connected to the first voltage input end; the noise reduction sub-circuit is configured to control the pull-up node to be connected to the first voltage input end when the potential of the pull-down node is at a second level; control the gate driving signal output end to be connected to the first voltage input end, to reduce noise on the pull-up node and the gate driving signal output end; and the noise reduction sub-circuit is further configured to control to disconnect the pull-up node and the first voltage input end when the potential of the pull-down node is at a first level; and control to disconnect the gate driving signal output end and the first voltage input end.

In some embodiments, the noise reduction sub-circuit comprises a first noise reduction transistor and a second noise reduction transistor, a gate electrode of the first noise reduction transistor is connected to the pull-down node, a first electrode of the first noise reduction transistor is connected to the gate driving signal output end, and a second electrode of the first noise reduction transistor is connected to the first voltage input end; a gate electrode of the second noise reduction transistor is connected to the pull-down node, a first electrode of the second noise reduction transistor is connected to the pull-up node, and a second electrode of the second noise reduction transistor is connected to the first voltage input end; the first pull-down node control sub-circuit comprises a first pull-down control node control transistor, a second pull-down control node control transistor, a first pull-down node control transistor and a second pull-down node control transistor; a gate electrode of the first pull-down control node control transistor is connected to the first clock signal input end, a first electrode of the first pull-down control node control transistor is connected to the first clock signal input end and a second electrode of the first pull-down control node control transistor is connected to the pull-down control node; a gate electrode of the second pull-down control node control transistor is connected to the pull-up node, a first electrode of the second pull-down control node control transistor is connected to the pull-down control node, and a second electrode of the second pull-down control node control transistor is connected to the first voltage input end; a gate electrode of the first pull-down node control transistor is connected to the pull-down control node, a first electrode of the first pull-down node control transistor is connected to the first clock signal input end, and a second electrode of the first pull-down node control transistor is connected to the pull-down node; and a gate electrode of the second pull-down node control transistor is connected to the pull-up node, a first electrode of the second pull-down node control transistor is connected to the pull-down node, and a second electrode of the second pull-down node control transistor is connected to the first voltage input end.

In some embodiments, the shift register circuit further includes a pull-up node control sub-circuit, a storage capacitor sub-circuit, an output pull-up sub-circuit and an output pull-down sub-circuit. The pull-up node control sub-circuit is connected to an input end, the pull-up node control sub-circuit is connected to the first clock signal input end, the pull-up node control sub-circuit is connected to a reset end, the pull-up node control sub-circuit is connected to the pull-up node, and the pull-up node control sub-circuit is connected to the first voltage input end; and the pull-up node control sub-circuit is configured to control the potential of the pull-up node under the control of the input end, the first clock signal input end and the reset end. A first end of the storage capacitor sub-circuit is connected to the pull-up node, and a second end of the storage capacitor sub-circuit is connected to a gate driving signal output end. The output pull-up sub-circuit is connected to the pull-up node, the output pull-up sub-circuit is connected to the gate driving signal output end, and the output pull-up sub-circuit is connected to a second clock signal input end; and the output pull-up sub-circuit is configured to control to connect or disconnect the gate driving signal output end and the second clock signal input end under the control of the pull-up node. The output pull-down sub-circuit is connected to the reset end, the output pull-down sub-circuit is connected to the first clock signal input end, the output pull-down sub-circuit is connected to the first voltage input end, and the output pull-down sub-circuit is connected to the gate driving signal output end; and the output pull-down sub-circuit is configured to control the potential of the gate driving signal outputted by the gate driving signal output end under the control of the reset end and the first clock signal input end.

A method for driving the above shift register circuit includes: when a first clock signal input end inputs a first level, controlling, by a second pull-down node control sub-circuit, a pull-down control node to be connected to the first clock signal input end; and when a potential of the pull-down control node is at a first level, controlling, by the second pull-down node control sub-circuit, the pull-down node to be connected to the first clock signal input end, to control the potential of the pull-down node to be at the first level, and a noise reduction transistor included in a noise reduction sub-circuit to be turned off.

In some embodiments, the method further includes: when the first clock signal input end inputs a second level and a potential of the pull-up node is at the first level, controlling, by a first pull-down node control sub-circuit, the potential of the pull-down control node and the potential of the pull-down node to be at a second level, to control the noise reduction transistor to be turned on; when the first clock signal input end inputs the second level and the potential of the pull-up node is at the second level, controlling, by the first pull-down node control sub-circuit, the potential of the pull-down control node to be at the first level; and when the potential of the pull-down control node is at the second level, controlling, by the second pull-down node control sub-circuit, to disconnect the pull-down node and the first clock signal input end.

In some embodiments, the method includes, within a display period, an input step, an output step, a noise reduction step, and a threshold voltage correction step. In the input step, the first clock signal input end inputs the second level, and the potential of the pull-up node is at the second level, and a first pull-down node control sub-circuit controls the potential of the pull-down control node to be at the first level, and a second pull-down node control sub-circuit controls the pull-down node to be connected to the first clock signal input end, the potential of the pull-down node to be at the first level, and the noise reduction transistor to be turned off. In the output step, the first clock signal input end inputs the first level, the potential of the pull-up node is at the second level, and the second pull-down node control sub-circuit controls the pull-down control node to be connected to the first clock signal input end, the potential of the pull-down control node to be at a first level, and the second pull-down node control sub-circuit controls the pull-down node to be connected to the first clock signal input end, the potential of the pull-down node to be at a first level, and the noise reduction transistor to be turned off. In the noise reduction step, the first clock signal input end inputs the second level, the potential of the pull-up node is at the first level, and the first pull-down node control sub-circuit controls the potential of the pull-down control node to be at the second level, and the second pull-down node control sub-circuit controls to disconnect the pull-down node and the first clock signal input end, the first pull-down node control sub-circuit controls the potential of the pull-down node to be at a second level, the noise reduction transistor to be turned on. In the threshold voltage correction step, the first clock signal input end inputs the first level, the potential of the pull-up node is at the first level, and the second pull-down node control sub-circuit controls the pull-down control node to be connected to the first clock signal input end, the potential of the pull-down control node to be at the first level, and the second pull-down node control sub-circuit controls the pull-down node to be connected to the first clock signal input end, the potential of the pull-down node to be at the first level, and the noise reduction transistor to be turned off.

In some embodiments, the method further includes: repeatedly performing the noise reduction step and the threshold voltage correction step within the display period until an adjacent next display period begins.

A display device includes the above shift register circuit.

DETAILED DESCRIPTION

Transistors used in the following embodiments are thin film transistors or field effect transistors or other devices having same characteristics. In the following embodiments, in order to distinguish two electrodes of the transistor other than the gate electrode, one electrode is referred to as a first electrode and the other electrode is referred to as a second electrode. In some embodiments, the first electrode is a drain electrode; the second electrode is a source electrode. In some other embodiments, the first electrode is a source electrode, and the second electrode is a drain electrode.

Figure 1:
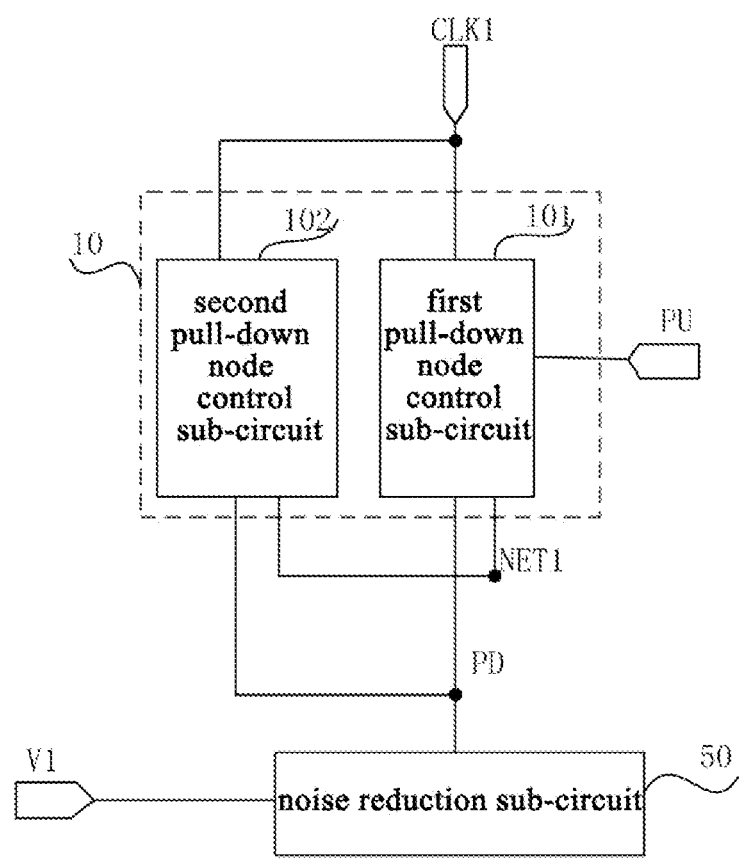
FIG. 1 is a schematic diagram showing a pull-down node control sub-circuit in a shift register circuit according to some embodiments of the present disclosure.

In some embodiments, as shown in FIG. 1, the shift register circuit includes a noise reduction sub-circuit 50 and a pull-down node control sub-circuit 10.

A control end of the noise reduction sub-circuit 50 is connected to a pull-down node PD. A first voltage input end inputs a first voltage signal V1 to the noise reduction sub-circuit 50.

The pull-down node control sub-circuit 10 includes a first pull-down node control sub-circuit 101 and a second pull-down node control sub-circuit 102.

The first pull-down node control sub-circuit 101 is connected to the pull-down control node NET1, the first pull-down node control sub-circuit 101 is connected to the pull-down node PD, and the first pull-down node control sub-circuit 101 is connected to a pull-up node PU, the first pull-down node control sub-circuit 101 is connected to a first clock signal input end. The first clock signal input end is configured to input a first clock signal CLK1. The first voltage input end is configured to input a first voltage signal V1.

The second pull-down node control sub-circuit 102 is connected to the first clock signal input end, a second pull-down node control sub-circuit 102 is connected to the pull-down control node NET1, and a second pull-down node control sub-circuit 102 is connected to the pull-down node PD. The second pull-down node control sub-circuit 102 is configured to control the connection between the pull-down control node NET1 and the first clock signal input end when the first clock signal input end inputs a first level; and control the connection between the pull-down node PD and the first clock signal input end when the potential of the pull-down control node NET1 is at the first level, so that the potential of the pull-down node PD is at a first level to control a noise reduction transistor included in the noise reduction sub-circuit 50 to be turned off.

In some embodiments, the shift register circuit includes the noise reduction sub-circuit 50 shown in FIG. 1, and a pull-down node control sub-circuit 10 associated with the threshold voltage compensation of the noise reduction transistor included in the noise reduction sub-circuit 50, and a pull-up node control sub-circuit, a storage capacitor sub-circuit, an output pull-up sub-circuit, and an output pull-down sub-circuit. The shift register circuit is configured to generate a corresponding gate driving signal.

In some embodiments, the noise reduction sub-circuit 50 includes at least one noise reduction transistor. A gate electrode of the noise reduction transistor is a control end of the noise reduction sub-circuit 50, and connected to the pull-down node PD.

When the shift register circuit in the above embodiment is in operation, and the potential of CLK1 is at the first level, the second pull-down node control sub-circuit 102 controls the pull-down control node NET1 to be connected to the first clock signal input end, so that the potential of the pull-down control node NET1 is at a first level; controls the pull-down node PD to be connected to the first clock signal input end, so that the potential of the pull-down node PD is at the first level; and controls the noise reduction transistor included in the noise reduction sub-circuit 50 to be turned off, so as to compensate the drift of the threshold voltage of the noise reduction transistor.

A second pull-down node control sub-circuit 102 is added to the pull-down node control sub-circuit 10 in the shift register circuit, so that the potential of the pull-down node PD is the first level and the second level alternately after the end of the output phase in each display period. It will be not occurred that the potential of the pull-down node is continuously at the second level after the end of the output phase in each display period as in the related art. The gate electrode of the noise reduction transistor in the noise reduction sub-circuit 50 is connected to the pull-down node PD, which improves the threshold voltage drift of the noise reduction transistor, improves the stability of the gate driving circuit, and enables the gate driving signal to be outputted stably.

When the shift register circuit in the above embodiment is in operation, the gate electrode of the noise reduction transistor is connected to the pull-down node PD, and when the potential of the pull-down node PD is at the second level, the noise reduction transistor is turned on. When the potential of the pull-down node is at the first level, the noise reduction transistor is turned off, and the threshold voltage drift of the noise reduction transistor is compensated by adding a reverse voltage, and the voltage at the gate electrode of the noise-reduction transistor is biased reversely, so as to correct the threshold voltage of the noise reduction transistor in real time.

When the noise reduction transistor is an n-type transistor, the second level is a high level, and the first level is a low level. When the noise reduction transistor is a p-type transistor, the second level is a low level, and the first level is a high level.

When transistors included in the second pull-down node control sub-circuit are all p-type transistors, and transistors included in the first pull-down node control sub-circuit are all n-type transistors, the first level is a low level. When transistors included in the second pull-down node control sub-circuit are all n-type transistors, and transistors included in first pull-down node control sub-circuit are all p-type transistors, the first level is a high level.

In some embodiments, the first pull-down node control sub-circuit 101 is configured to control the potential of the pull-down control node NET1 and the potential of the pull-down node PD to be both at a second level when the first clock signal input end inputs a second level and the potential of the pull-up node PU is at a first level, so as to control the noise reduction transistor included in the noise reduction sub-circuit to be turned on. In some embodiments, the first pull-down node control sub-circuit 101 is further configured to control the potential of the pull-down control node NET1 to be at the first level when the first clock signal input end inputs a second level and the potential of the pull-up node PU is at a second level.

The second pull-down node control sub-circuit 102 is further configured to control to disconnect the pull-down node PD and the first clock signal input end when the potential of the pull-down control node NET1 is at a second level.

In some implementations, when the first clock signal input end inputs a second level and the potential of the pull-up node PU is at a first level, the first pull-down node control sub-circuit 101 controls the potential of the pull-down control node NET1 and the potential of the pull-down node PD to be both at a second level. At this time, the second pull-down node control sub-circuit 102 does not affect the potential of the pull-down node PD, and the gate electrode of the noise reduction transistor is connected to the pull-down node PD and the noise reduction transistor is turned on.

In some embodiments, the noise reduction sub-circuit 50 is further connected to the pull-up node PU, the noise reduction sub-circuit 50 is further connected to the gate driving signal output end, and the noise reduction sub-circuit 50 is further connected to the first voltage input end. In some embodiments, the noise reduction sub-circuit is configured to control the pull-up node PU to be connected to the first voltage input end when the potential of the pull-down node PD is at a second level; control the gate driving signal output end to be connected to the first voltage input end, to perform noise reduction on the pull-up node PU and the gate driving signal output end.

In some embodiments, the noise reduction sub-circuit 50 is further configured to control to disconnect the pull-up node PU and the first voltage input end when the potential of the pull-down node PD is at a first level; and control to disconnect the gate driving signal output end and the first voltage input end.

In some embodiments, the noise reduction sub-circuit 50 includes a first noise reduction transistor and a second noise reduction transistor.

A gate electrode of the first noise reduction transistor is connected to the pull-down node PD, a first electrode of the first noise reduction transistor is connected to the gate driving signal output end, and a second electrode of the first noise reduction transistor is connected to the first voltage input end.

A gate electrode of the second noise reduction transistor is connected to the pull-down node PD, a first electrode of the second noise reduction transistor is connected to the pull-up node PU, and a second electrode of the second noise reduction transistor is connected to the first voltage input end.

Figure 2:
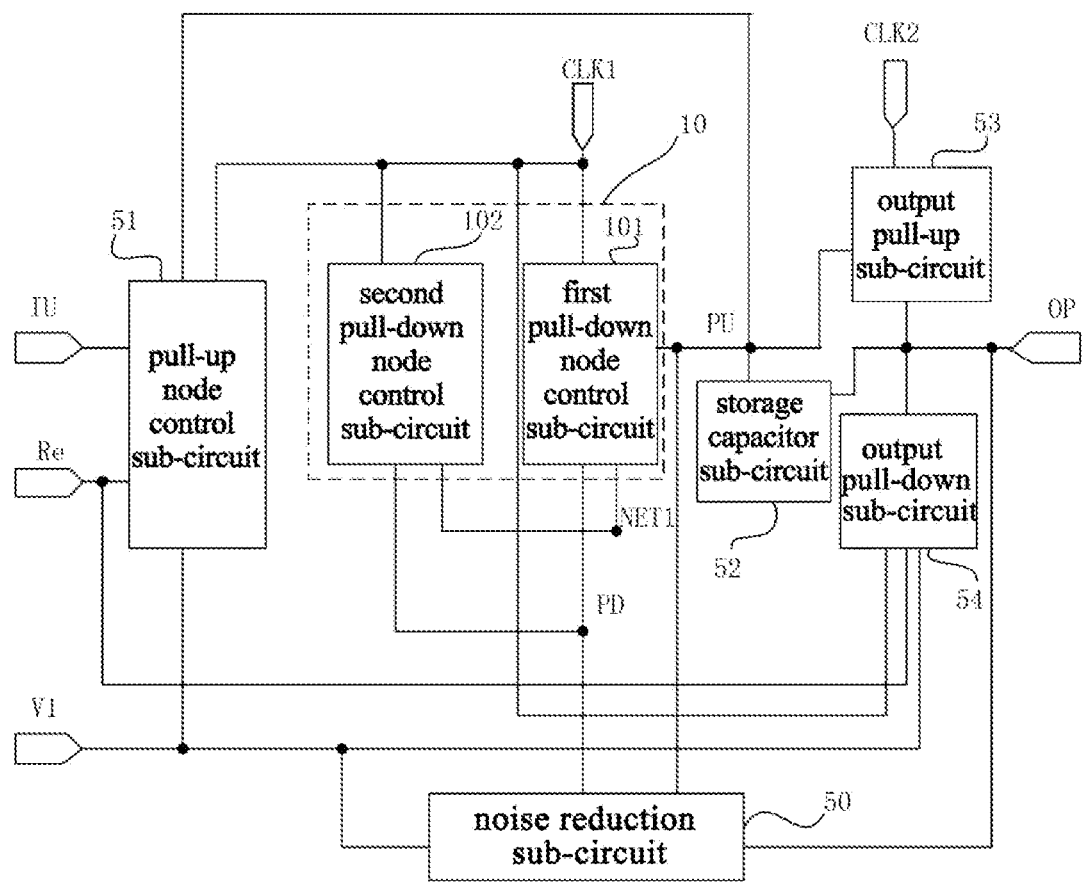
FIG. 2 is a schematic diagram showing a shift register circuit according to some embodiments of the present disclosure.

In some embodiments, as shown in FIG. 2, on the basis of the embodiment of the shift register circuit shown in FIG. 1, the noise reduction sub-circuit 50 is further connected to the pull-up node PU, and the noise reduction sub-circuit 50 is further connected to the gate driving signal output end, and the noise reduction sub-circuit 50 is further connected to the first voltage input end. The noise reduction sub-circuit 50 is configured to control the pull-up node PU to be connected to the first voltage input end when the potential of the pull-down node PD is at a second level, and control the gate driving signal output end OP to be connected to the first voltage input end, to perform noise reduction on the pull-up node PU and the gate driving signal output end. In some embodiments, the noise reduction sub-circuit 50 is further configured to control to disconnect the pull-up node PU and the first voltage input end when the potential of the pull-down node PD is at a first level, and control to disconnect the gate driving signal output end OP and the first voltage input end. The first voltage input end is configured to input the first voltage V1.

In some embodiments, as shown in FIG. 2, the shift register circuit further includes a pull-up node control sub-circuit 51, a storage capacitor sub-circuit 52, an output pull-up sub-circuit 53 and an output pull-down sub-circuit 54.

The pull-up node control sub-circuit 51 is connected to an input end IU, the pull-up node control sub-circuit 51 is connected to the first clock signal input end, the pull-up node control sub-circuit 51 is connected to the reset end Re, and the pull-up node control sub-circuit 51 is connected to the pull-up node PU, and the pull-up node control sub-circuit 51 is connected to the first voltage input end. The pull-up node control sub-circuit 51 is configured to control the potential of the pull-up node PU under the control of the input end IU, the first clock signal input end and the reset end Re. The first clock signal input end is configured to input a first clock signal CLK1, and the first voltage input end is configured to input a first voltage signal V1.

The first end of the storage capacitor sub-circuit 52 is connected to the pull-up node PU, and the second end of the storage capacitor sub-circuit 52 is connected to the gate driving signal output end OP.

The output pull-up sub-circuit 53 is connected to the pull-up node PU, the output pull-up sub-circuit 53 is connected to the gate driving signal output end OP, and the output pull-up sub-circuit 53 is connected to the second clock signal input end. The output pull-up sub-circuit 53 is configured to control to connect or disconnect the gate driving signal output end OP and the second clock signal input end under the control of the pull-up node PU. The second clock signal input end is configured to input the second clock signal CLK2.

The output pull-down sub-circuit 54 is connected to the reset end Re, the output pull-down sub-circuit 54 is connected to the first clock signal input end, the output pull-down sub-circuit 54 is connected to the first voltage input end, and the output pull-down sub-circuit 54 is connected to the gate driving signal output end OP. The output pull-down sub-circuit 54 is configured to control the voltage of the gate driving signal outputted by the gate driving signal output end OP under the control of the reset end Re and the first clock signal input end.

Figure 3:
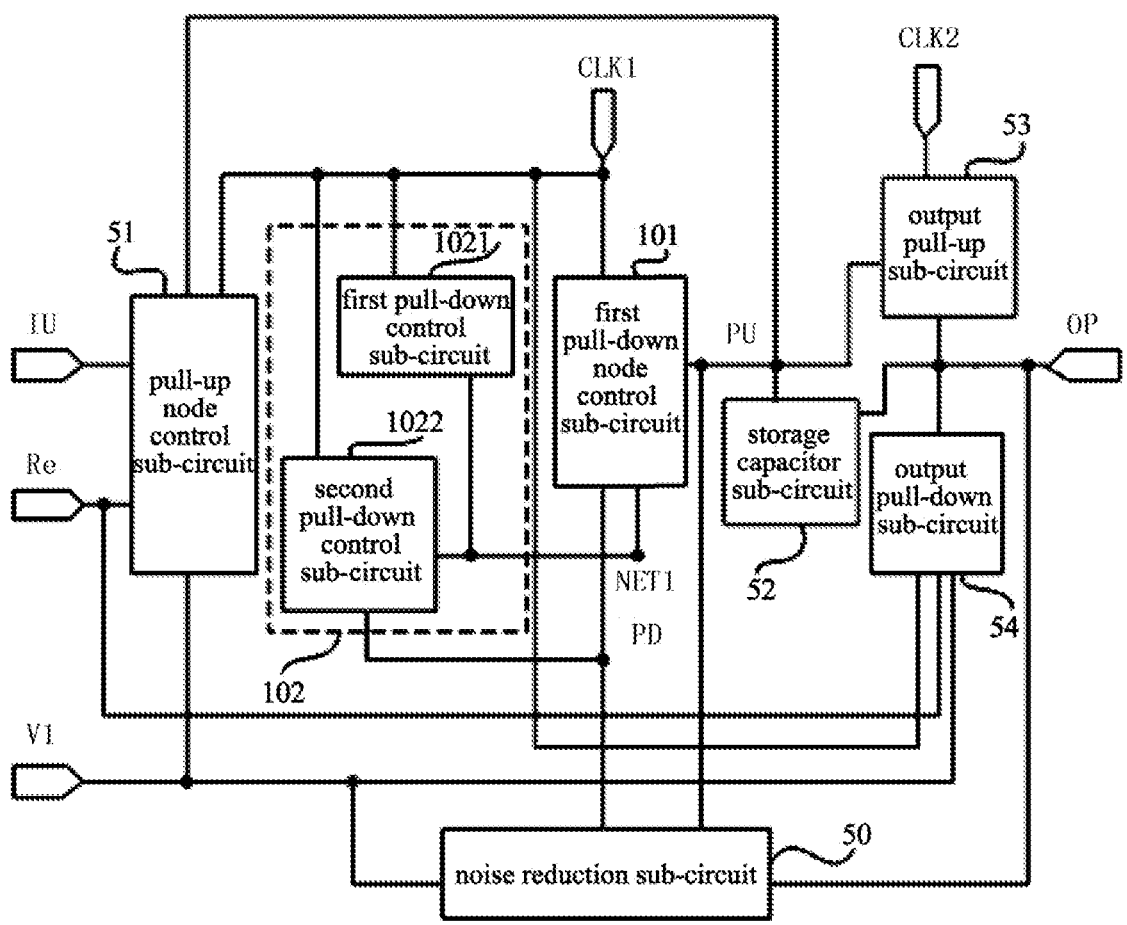
FIG. 3 is another schematic diagram showing a shift register circuit according to some embodiments of the present disclosure.

In some embodiments, as shown in FIG. 3, the second pull-down node control sub-circuit 102 includes a first pull-down control sub-circuit 1021 and a second pull-down control sub-circuit 1022.

The first pull-down control sub-circuit 1021 is connected to the first clock signal input end, and the first pull-down control sub-circuit 1021 is connected to the pull-down control node NET1. The first pull-down control sub-circuit 1021 is configured to control the connection between the pull-down control node NET1 and the first clock signal input end when the first clock signal input end inputs the first level.

The second pull-down control sub-circuit 1022 is connected to the pull-down control node NET1, the second pull-down control sub-circuit 1022 is connected to the first clock signal input end, and the second pull-down control sub-circuit 1011 is connected to the pull-down node PD. The second pull-down control sub-circuit 1022 is configured to control connection between the pull-down node PD and the first clock signal input end when the potential of the pull-down control node NET1 is at a first level.

In the above embodiment, the second pull-down node control sub-circuit 102 includes a first pull-down control sub-circuit 1021 and a second pull-down control sub-circuit 1022, and the first pull-down control sub-circuit 1021 is configured to control the potential of the pull-down control node NET1 to be a first level when the first clock signal input end inputs the first level is input, and the second pull-down control sub-circuit 1022 is configured to control the potential of the pull-down node PD to be at the first level when the potential of the pull-down control node NET1 is at a first level.

In some embodiments, the first pull-down control sub-circuit 1021 includes a first pull-down control transistor. A gate electrode of the first pull-down control transistor is connected to the first clock signal input end, a first electrode of the first pull-down control transistor is connected to the pull-down control node, and a second electrode of the first pull-down control transistor is connected to the first clock signal input end.

In some embodiments, transistors included in the first pull-down node control sub-circuit 101 are all n-type transistors, and the first pull-down control transistor is a p-type transistor.

In some embodiments, transistors included in the first pull-down node control sub-circuit 101 are p-type transistors, and the first pull-down control transistor is an n-type transistor.

The first pull-down node control sub-circuit 101 includes a transistor of a type opposite to that of the first pull-down control transistor, so that the first pull-down control transistor controls the potential of the pull-down control node to be a first level when the first clock signal input end inputs a first level.

In some embodiments, the second pull-down control sub-circuit 1022 includes a second pull-down control transistor. A gate electrode of the second pull-down control transistor is connected to the pull-down control node NET1, and a first electrode of the second pull-down control transistor is connected to the pull-down node PD, and the second electrode of the second pull-down control transistor is connected to the first clock signal input end.

In some embodiments, transistors included in the first pull-down node control sub-circuit 101 are all n-type transistors, and the second pull-down control transistor is a p-type transistor.

In some embodiments, transistors included in the first pull-down node control sub-circuit 101 are p-type transistors, and the second pull-down control transistor is an n-type transistor.

The first pull-down node control sub-circuit 101 includes a transistor of a type opposite to that of the second pull-down control transistor, so that the second pull-down control transistor controls the potential of the pull-down node PD to be a first level when the potential of the pull-down control node NET1 is the first level.

Figure 4:
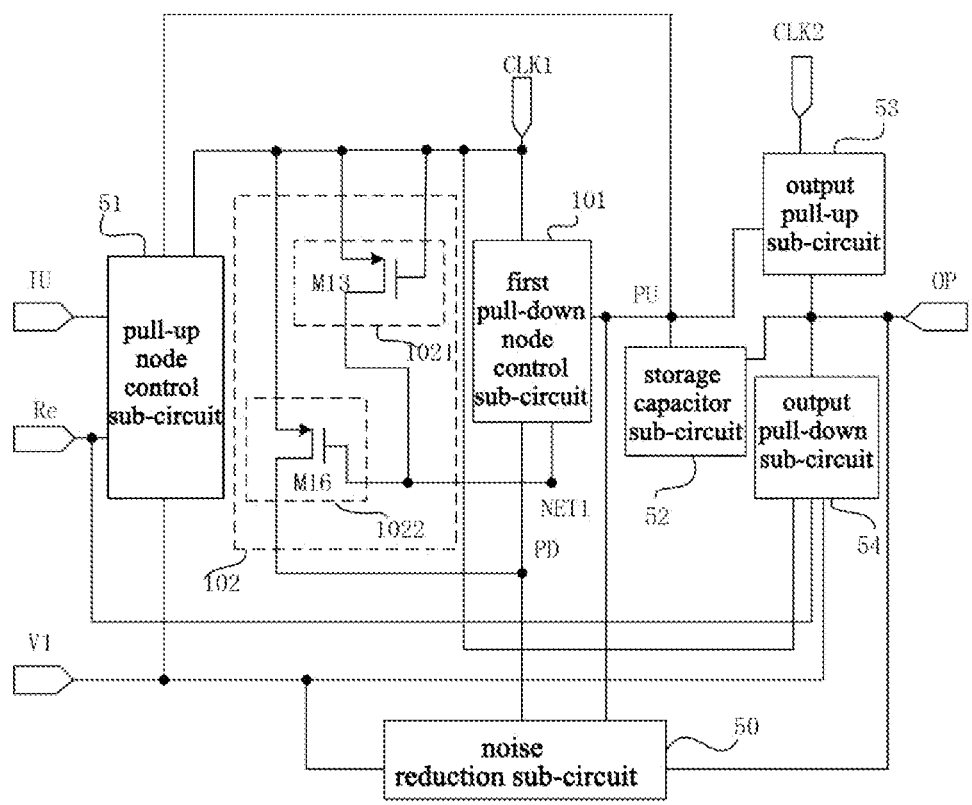
FIG. 4 is a circuit diagram showing a shift register circuit according to some embodiments of the present disclosure.

As shown in FIG. 4, on the basis of the embodiment of the shift register circuit shown in FIG. 3, the first pull-down control sub-circuit 1021 includes a first pull-down control transistor M13, and the second pull-down control sub-circuit 1022 includes a second pull-down control transistor M16.

The gate electrode of M13 is connected to the first clock signal input end, the drain electrode of M13 is connected to the pull-down control node NET1, and the source electrode of M13 is connected to the first clock signal input end. The first clock signal input end is configured to input the first clock signal CLK1.

The gate electrode of the second pull-down control transistor M16 is connected to the pull-down control node NET1, the drain electrode of M16 is connected to the pull-down node PD, and the source electrode of M16 is connected to the first clock signal input end.

In some embodiments, in the shift register circuit shown in FIGS. 4, M13 and M16 are p-type transistors, the first level is a low level, and noise reduction transistors included in the noise reduction sub-circuit 50 are all n-type transistors.

In some embodiments, M13 and M16 are n-type transistors, the first level is a high level, and the noise reduction transistor is a p-type transistor.

When the shift register circuit shown in FIG. 4 is in operation and CLK1 is at a low level, M13 is turned on, so that the potential of NET1 is at a low level, and M16 is turned on, so that the potential of the PD is at a low level, thereby enabling the noise reduction transistors included in the noise reduction sub-circuit 50 being turned off to compensate the threshold voltage drift of the noise reduction transistor.

In some embodiments, the first pull-down node control sub-circuit 101 includes a first pull-down control node control transistor, a second pull-down control node control transistor, a first pull-down node control transistor, and a second pull-down node control transistor.

The first pull-down control node controls a gate electrode of the transistor to be connected to the first clock signal input end, a first pull-down control node controls a first electrode of the transistor to be connected to the first clock signal input end, and a first pull-down control node controls a second electrode of the transistor to be connected to the pull-down control node NET1.

A second pull-down control node controls a gate electrode of the transistor to be connected to the pull-up node, a second pull-down control node controls a first electrode of the transistor to be connected to the pull-down control node NET1, and a second pull-down control node controls a second electrode of the transistor to be connected to the first voltage input end.

A gate electrode of the first pull-down node control transistor is connected to the pull-down control node NET1, a first electrode of the first pull-down node control transistor is connected to the first clock signal input end, and the second electrode of the first pull-down node control transistor is connected to the pull-down node PD.

A gate electrode of the second pull-down node control transistor is connected to the pull-up node PU, a first electrode of the second pull-down node control transistor is connected to the pull-down node PD, and the second electrode of the second pull-down node control transistor is connected to the first voltage input end.

Figure 5:
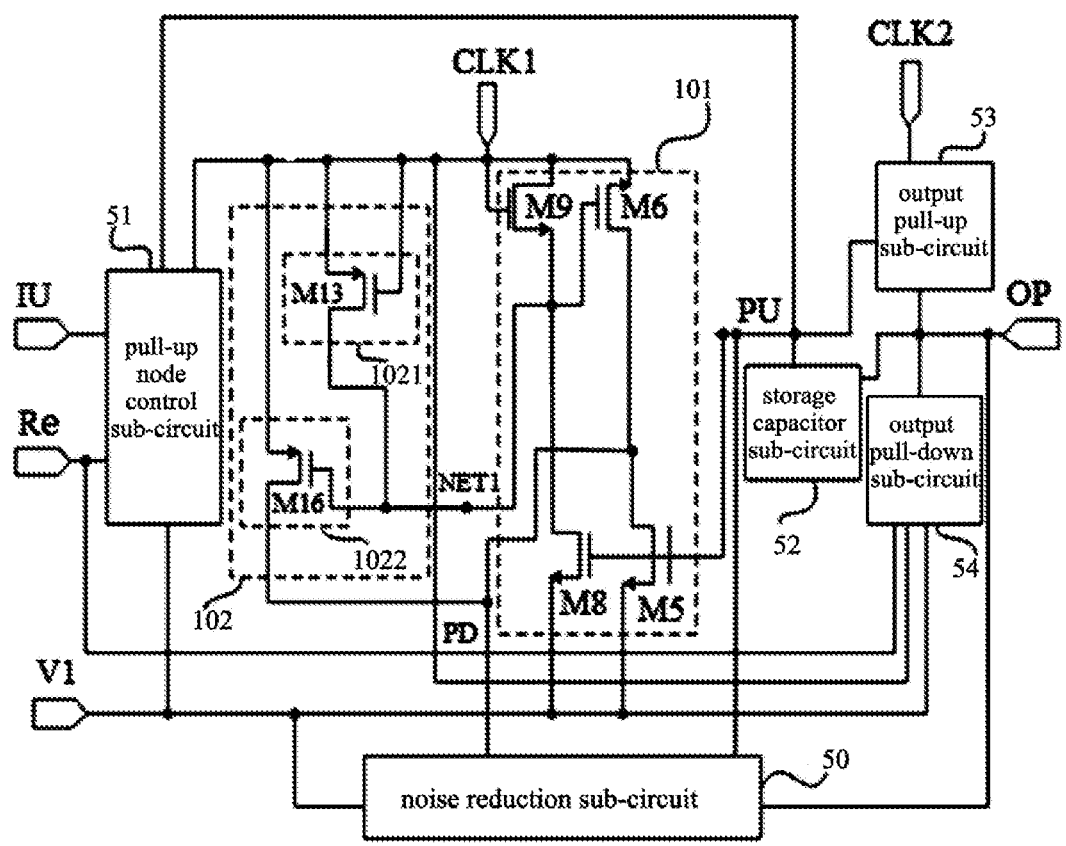
FIG. 5 is yet another schematic diagram showing a shift register circuit according to some embodiments of the present disclosure.

In some embodiments, as shown in FIG. 5, the first pull-down node control sub-circuit 101 in the shift register circuit includes a first pull-down control node control transistor M9, a second pull-down control node control transistor M8, and a first pull-down node control transistor M6 and the second pull-down node control transistor M5.

The gate electrode and the drain electrode of the first pull-down control node control transistor M9 is connected to the first clock signal input end, and the source electrode of M9 is connected to the pull-down control node NET1.

The gate electrode of the second pull-down control node control transistor M8 is connected to the pull-up node PU, the drain electrode of M8 is connected to the pull-down control node NET1, and the source electrode of M8 is connected to the first voltage input end.

The gate electrode of the first pull-down node control transistor M6 is connected to the pull-down control node NET1, the drain electrode of M6 is connected to the first clock signal input end, and the source electrode of M6 is connected to the pull-down node PD.

The gate electrode of the second pull-down node control transistor M5 is connected to the pull-up node PU, the drain electrode of M5 is connected to the pull-down node PD, and the source electrode of M5 is connected to the first voltage input end.

In the embodiment shown in FIG. 5, M9, M8, M6, and M5 are all n-type transistors. In some embodiments, the above transistors M9, M8, M6, and M5 are all p-type transistors.

In the embodiment shown in FIG. 5, for example, the first voltage is a low voltage VSS.

When the shift register circuit as shown in FIG. 5 is in operation, the potential of CLK1 is at a high level, and the potential of PU is at a low level, M9 is turned on, M8 is turned off, and the potential of NET1 is at a high level.

When the shift register circuit as shown in FIG. 5 is in operation, the potential of CLK1 is at a high level and the potential of the PU is also at a high level, both M9 and M8 are turned on, and the width to length ratio of M9 is set to be not less than the width to length ratio of M8 (for example, the width to length ratio of M9 is equal to the width to length ratio of M8) so that the potential of NET1 is at a high level.

When the potential of the PU is at a low level, M6 is turned on, M5 is turned off, and the potential of the PD is at a high level. When the potential of the PU is also at a high level, both M6 and M5 are turned on, and the potential of the PD is at a low level by setting the width to length ratio of M6 to be smaller than that of M5.

In some embodiments, the noise reduction sub-circuit 50 includes a first noise reduction transistor and a second noise reduction transistor.

A gate electrode of the first noise reduction transistor is connected to the pull-down node PD, a first electrode of the first noise reduction transistor is connected to the gate driving signal output end, and a second electrode of the first noise reduction transistor is connected to the first voltage input end.

A gate electrode of the second noise reduction transistor is connected to the pull-down node PD, a first electrode of the second noise reduction transistor is connected to the pull-up node PU, and a second electrode of the second noise reduction transistor is connected to the first voltage input end.

In some embodiments, the pull-up node control sub-circuit 51 includes an input transistor, a pull-up node reset transistor, and a pull-up node control transistor.

A gate electrode of the input transistor is connected to the input end, the first electrode of the input transistor is connected to the input end, and the second electrode of the input transistor is connected to the pull up node.

A gate electrode of the pull-up node reset transistor is connected to the reset end, a first electrode of the pull-up node reset transistor is connected to the pull-up node, and a second electrode of the pull-up node reset transistor is connected to the first voltage input end.

A gate electrode of the pull-up node control transistor is connected to the first clock signal input end, a first electrode of the pull-up node control transistor is connected to the input end, and a second electrode of the pull-up node control transistor is connected to the pull-up node.

In some embodiments, the storage capacitor sub-circuit 52 includes a storage capacitor, a first end of the storage capacitor is connected to the pull-up node, and a second end of the storage capacitor is connected to the gate driving signal output end.

In some embodiments, the output pull-up sub-circuit 53 includes a pull-up transistor, a gate electrode of the pull-up transistor is connected to the pull-up node, and the first electrode of the pull-up transistor is connected to the second clock signal input end, and a second electrode of the pull-up transistor is connected to the gate driving signal output end.

In some embodiments, the output pull-down sub-circuit 54 includes an output reset transistor and a pull-down transistor.

A gate electrode of the output reset transistor is connected to the reset end, a first electrode of the output reset transistor is connected to the gate driving signal output end, and a second electrode of the output reset transistor is connected to the first voltage input end.

A gate electrode of the pull-down transistor is coupled to the first clock signal input end, a first electrode of the pull-down transistor is connected to the gate driving signal output end, and a second electrode of the pull-down transistor is connected to the first voltage input end.

In some embodiments, a gate electrode of the first pull-down transistor and a gate electrode of the second pull-up node control transistor are connected to a pull-down node, and the first pull-down transistor and the second pull-up node control transistor are noise reduction transistors.

Figure 6:
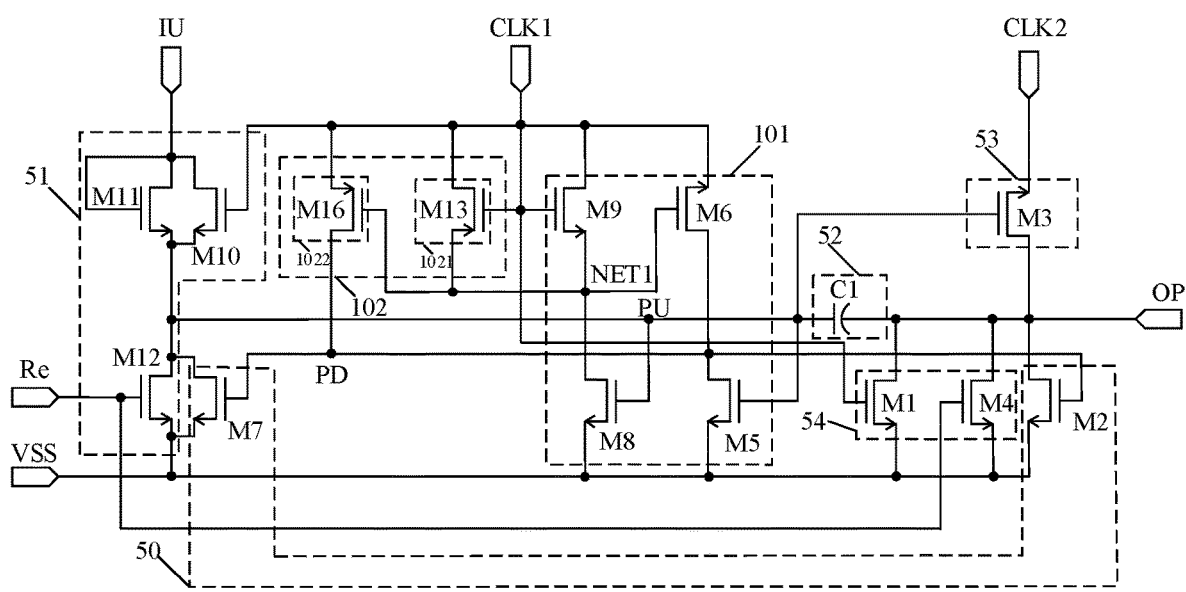
FIG. 6 is another circuit diagram showing a shift register circuit according to some embodiments of the present disclosure.

In some embodiments, as shown in FIG. 6, the shift register circuit includes a pull-down node control sub-circuit 101, a noise reduction sub-circuit 50, a pull-up node control sub-circuit 51, a storage capacitor sub-circuit 52, an output pull-up sub-circuit 53 and the output pull-down sub-circuit 54.

The pull-down node control sub-circuit 10 includes a first pull-down node control sub-circuit 101 and a second pull-down node control sub-circuit 102.

The second pull-down node control sub-circuit 102 includes a first pull-down control sub-circuit 1021 and a second pull-down control sub-circuit 1022.

The first pull-down control sub-circuit 1021 includes a first pull-down control transistor M13, the gate electrode of M13 is connected to the first clock signal input end inputting the first clock signal CLK1, and the drain electrode of M13 is connected to the pull-down control node NET1, and the source electrode of M13 is connected to the first clock signal input end.

The second pull-down control sub-circuit 1022 includes a second pull-down control transistor M16, a gate electrode of M16 is connected to the pull-down control node NET1, drain electrode of M16 is connected to the pull-down node PD, and a source electrode of M16 is connected to the first clock signal input end. The first clock signal input end is configured to input the first clock signal CLK1.

The first pull-down node control sub-circuit 101 includes a first pull-down control node control transistor M9, a second pull-down control node control transistor M8, a first pull-down node control transistor M6, and a second pull-down node control transistor M5.

A gate electrode of M9 is connected to the first clock signal input end, a drain electrode of M9 is connected to the first clock signal input end, and a source electrode of M9 is connected to the pull-down control node NET1.

The gate electrode of M8 is connected to the pull-up node PU, the drain electrode of M8 is connected to the pull-down control node NET1, and the source electrode of M8 is connected to the low voltage input end. The low voltage input is set to input a low voltage VSS.

The gate electrode of M6 is connected to the pull-down control node NET1, the drain electrode of M6 is connected to the first clock signal input end, and the source electrode of M6 is connected to the pull-down node PD.

The gate electrode of M5 is connected to the pull-up node PU, the drain electrode of M5 is connected to the pull-down node PD, and the source electrode of M5 is connected to the low voltage input end.

The noise reduction sub-circuit 50 includes a first noise reduction transistor M2 and a second noise reduction transistor M7.

The gate electrode of M2 is connected to the pull-down node PD, the drain electrode of M2 is connected to the gate driving signal output end OP, and the source electrode of M2 is connected to the low voltage input end.

The gate electrode of M7 is connected to the pull-down node PD, the drain electrode of M7 is connected to the pull-up node PU, and the source electrode of M7 is connected to the low voltage input end.

The pull-up node control sub-circuit 51 includes a pull-up node control transistor M10, an input transistor M11, and a pull-up node reset transistor M12.

Both the gate electrode and the drain electrode of M11 are connected to the input end IU, and the source electrode of M11 is connected to the pull-up node PU.

The gate electrode of the pull-up node reset transistor M12 is connected to the reset end Re, the drain electrode of M12 is connected to the pull-up node PU, and the source electrode of M12 is connected to the low voltage input end inputting the low voltage VSS.

A gate electrode of the pull-up node control transistor M10 is connected to the first clock signal input end inputting the first clock signal CLK1, a drain electrode of the M10 is connected to the input end IU, and a source electrode of the M10 is connected to the pull-up node PU.

The storage capacitor sub-circuit 52 includes a storage capacitor C1, a first end of C1 is connected to the pull-up node PU, and a second end of C1 is connected to the gate driving signal output end OP.

The output pull-up sub-circuit 53 includes a pull-up transistor M3.

The gate electrode of M3 is connected to the pull-up node PU, the drain electrode of M3 is connected to the second clock signal input end inputting the second clock signal CLK2, and the source electrode of M3 is connected to the gate driving signal output end OP.

The output pull-down sub-circuit 54 includes a pull-down transistor M1 and an output reset transistor M4.

The gate electrode of M4 is connected to the reset end Re, the drain electrode of M4 is connected to the gate driving signal output end OP, and the source electrode of M4 is connected to the low voltage input end inputting the low voltage VSS.

A gate electrode of the pull-down transistor M1 is connected to the first clock signal input end inputting the first clock signal CLK1, a drain electrode of M1 is connected to the gate driving signal output end OP, and a source electrode of the M1 is connected to the low voltage input end.

In the embodiment shown in FIG. 6, both M13 and M16 are p-type transistors, and the remaining transistors are all n-type transistors.

Figure 7:
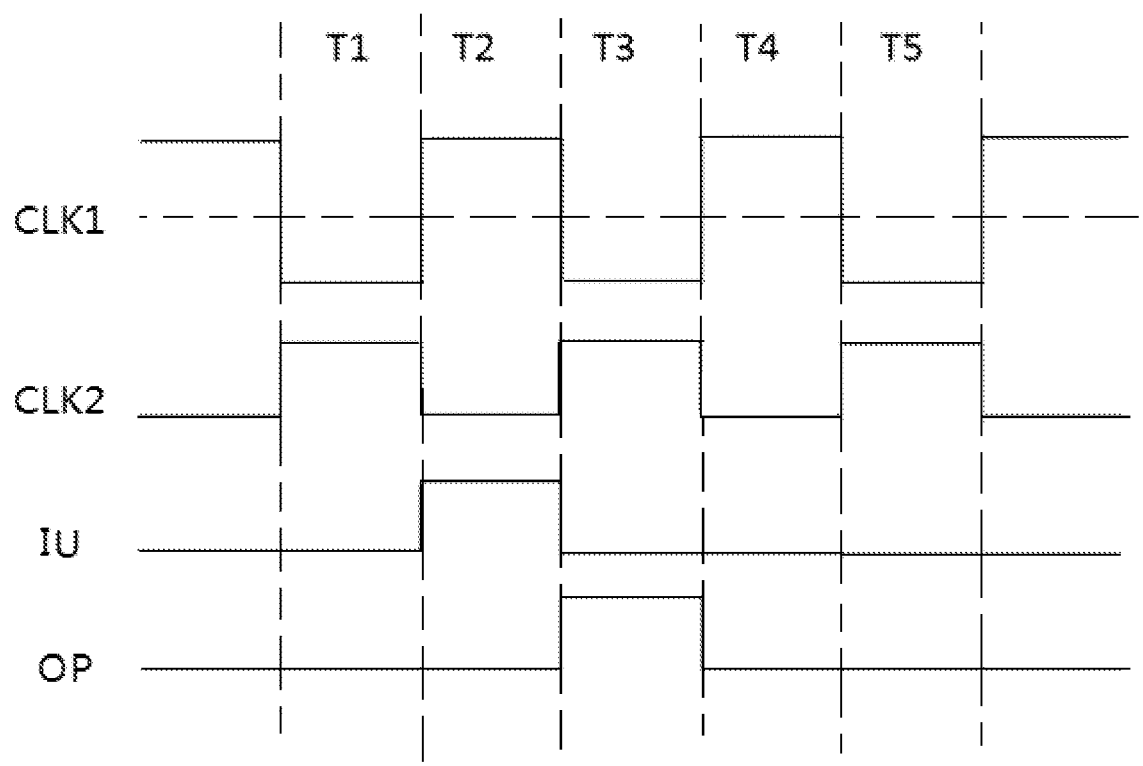
FIG. 7 is a timing sequence diagram showing the operation of the shift register circuit according to some embodiments of the present disclosure.

As shown in FIG. 7, the time sequence of the shift register circuit shown in FIG. 6 includes the following phases.

In the first phase T1, IU inputs a low level, the potential of CLK1 is at a low level, the potential of CLK2 is at a high level, the potential of PU is at a low level, M9 is turned off, M8 is turned off, M13 is turned on. Thus, the potential of NET1 is at a low level, and M16 is turned on, so that the potential of PD is at a low level, so that both M2 and M7 are turned off.

In the second phase T2 (the input phase), the IU inputs a high level, the potential of CLK1 is at a high level, the potential of CLK2 is at a low level, M9 and M8 are both turned on, the width to length ratio of M9 is set to not less than the width to length ratio of M8 (for example, the width to length ratio of M9 is equal to the width to length ratio of M8), so that the potential of NET1 is at a high level, M13 is turned off, M16 is turned off, M5 is turned on, M6 is turned on, the width to length ratio of M6 is set to be smaller than that of M5, so that the potential of the PD is at a low level at this time, so that both of M2 and M7 are turned off.

In the third phase T3 (the output phase), IU inputs a low level, the potential of CLK1 is at a low level, the potential of CLK2 is at a high level, the potential of PU is at a high level, M9 is turned off, M8 is turned on, M13 is turned on. The potential of NET1 is at a low level, M6 is turned off, M5 is turned on, and M16 is turned on, so that the potential of PD is at a low level, so that both M2 and M7 are turned off.

In the fourth phase T4 (the noise reduction phase), IU inputs a low level, the potential of CLK1 is at a high level, the potential of CLK2 is at a low level, the potential of PU is at a low level, M5 and M8 are both turned off, M9 is turned on, M13 is turned off, the potential of NET1 is at a high level, M6 is turned on, and M16 is turned off, so that the potential of PD is at a high level, so that both M2 and M7 are turned on, and noise is reduced for OP and PU.

In the fifth phase T5 (the threshold voltage correction phase), IU inputs a low level, the potential of CLK1 is at a low level, the potential of CLK2 is at a high level, the potential of PU is at a low level, M9, M8 and M5 are turned off, M13 is turned on, so that the potential of NET1 is at a low level, M6 is turned off, M16 is turned on, so that the potential of PD is at a low level, M2 and M7 are both turned off, the voltage of the gate electrode of M2 and the voltage of the gate electrode of M7 are both a low level, and the threshold voltage of M2 and the threshold voltage of M7 are corrected.

During the following time within one display period, the noise reduction phase and the threshold voltage correction phase are sequentially performed, that is, the switching between the noise cancellation phase and the threshold voltage correction phase is repeated until the display period ends. The noise is continuously reduced and the threshold voltage of the noise reduction transistor is continuously compensated, thereby enabling a stable display.

The display period is a time period required to scan all stages of shift register circuits included in a gate driving circuit.

The gate driving circuit includes several stages of shift register circuits in a cascaded connection. In the gate driving circuit, in addition to the first stage of shift register circuit, the input end of each stage of shift register circuit is connected to the gate driving signal output end of a previous stage of shift register circuit; and in addition to the last stage of shift register circuit, the reset end of each stage of shift register circuit is connected to the gate driving signal output end of the next stage of shift register circuit.

In some embodiments, as shown in FIG. 7, the voltage at the intersection of the waveform of CLK1 and a horizontal dashed line is the ground voltage Vgnd.

In the above embodiment, two p-type thin film transistors (TFTs), that is, M13 and M16, are added to the shift register circuit shown in FIG. 6. M13 and M16 together with the first pull-down node control sub-circuit 10 including M5, M6, M8 and M9 apply reverse bias to the voltage of the gate electrode of M2 and the voltage of the gate electrode of M7 with a low voltage signal by adjusting the time sequence of CLK1. The threshold voltage of M2 and the threshold voltage of M7 are corrected in real time, so as to stably output a corresponding gate driving signal.

In some embodiments, a method for driving a shift register circuit is applied to the above-described shift register circuit, and the method for driving the shift register circuit includes steps 110 and 120.

In step 110, when the first clock signal input end inputs the first level, the second pull-down node control sub-circuit controls the pull-down control node to be connected to the first clock signal input end.

In step 120, when the potential of the pull-down control node is at a first level, the second pull-down node control sub-circuit controls the pull-down node to be connected to the first clock signal input end, so that the potential of the pull-down node is at a first level, so as to control the noise reduction transistor included in the noise reduction sub-circuit to be turned off.

In the method for driving the shift register circuit in the above embodiment, the second pull-down node control sub-circuit added in the pull-down node control sub-circuit controls the potential of the pull-down node to be the first level and the second level alternately after the end of the output phase in each display period. It is not occurred that the potential of the pull-down node is continuously at the second level after the end of the output phase in each display period in the related art. The threshold drift of the noise reduction transistor whose gate electrode is connected to the pull-down node is improved, thereby improving the stability of the gate driving circuit and achieving a stable output of the gate driving signal.

In some embodiments, the method for driving the shift register circuit further includes the following steps.

When the first clock signal input end inputs the second level and the potential of the pull-up node is at the first level, the first pull-down node control sub-circuit controls the potential of the pull-down control node and the potential of the pull-down node to be at a second level, so as to control the noise reduction transistor included in the noise reduction sub-circuit to be turned on. When the first clock signal input end inputs the second level and the potential of the pull-up node is at the second level, the first pull-down node control sub-circuit controls the potential of the pull-down control node to be at the first level.

When the potential of the pull-down control node is at the second level, the second pull-down node control sub-circuit controls to disconnect the pull-down node and the first clock signal input end.

In some embodiments, the method for driving the shift register circuit includes an input step, an output step, a noise reduction step, and a threshold voltage correcting step within a display period.

In the input step (i.e., the input phase), the first clock signal input end inputs a second level, and the potential of the pull-up node is at the second level, and the first pull-down node control sub-circuit controls the potential of the pull-down control node to be at a first level, and the second pull-down node control sub-circuit controls the pull-down node to be connected to the first clock signal input end, so that the potential of the pull-down node is at a first level, thereby controlling the noise reduction transistor of the noise reduction sub-circuit to be turned off.

In the output step (i.e., the output phase), the first clock signal input end inputs the first level, the potential of the pull-up node is at the second level, and the second pull-down node control sub-circuit controls the pull-down control node to be connected to the first clock signal input end, so that the potential of the pull-down control node is at a first level, and the second pull-down node control sub-circuit controls the pull-down node to be connected to the first clock signal input end, so that the potential of the pull-down node is at a first level, thereby controlling the noise reduction transistor included in the noise reduction sub-circuit to be turned off.

In the noise reduction step (i.e., the noise reduction phase), the first clock signal input end inputs the second level, the potential of the pull-up node is at the first level, and the first pull-down node control sub-circuit control the potential of the pull-down control node to be at the second level, and the second pull-down node control sub-circuit controls disconnect the pull-down node and the first clock signal input end, the first pull-down node control sub-circuit controls the potential of the pull-down node to be at a second level, thereby controlling the noise reduction transistor included in the noise reduction sub-circuit to be turned on.

In the threshold voltage correction step (i.e., the threshold voltage correction phase), the first clock signal input end inputs the first level, the potential of the pull-up node is at the first level, and the second pull-down node control sub-circuit controls the pull-down control node to be connected to the first clock signal input end, so that a potential of the pull-down control node is at a first level, and the second pull-down node control sub-circuit controls the pull-down node to be connected to the first clock signal input end, so that the potential of the pull-down node is at a first level, thereby controlling the noise reduction transistor included in the noise reduction sub-circuit to be turned off.

In some embodiments, the method for driving the shift register circuit further includes repeatedly performing the noise reduction step and the threshold voltage correcting step within one display period until an adjacent next display period begins, thereby continuously reducing noise and compensating the threshold voltage of the noise reduction transistor, and displaying stably.

In some embodiments, the display device comprises the shift register circuit described above.

In some embodiments, the display device is any product or component having a display function, such as a cell phone, a tablet, a television, a display, a notebook computer, a digital photo frame, or a navigator.

What is claimed is:

1. A shift register circuit, comprising a noise reduction sub-circuit and a pull-down node control sub-circuit, wherein
    a control end of the noise reduction sub-circuit is connected to a pull-down node, the noise reduction sub-circuit is connected to a first voltage input end;
    the pull-down node control sub-circuit comprises a first pull-down node control sub-circuit and a second pull-down node control sub-circuit;
    the first pull-down node control sub-circuit is connected to a pull-down control node, the first pull-down node control sub-circuit is connected to the pull-down node, the first pull-down node control sub-circuit is connected to a pull-up node, and the first pull-down node control sub-circuit is connected to a first clock signal input end;
    the second pull-down node control sub-circuit is connected to the first clock signal input end, a second pull-down node control sub-circuit is connected to the pull-down control node, and a second pull-down node control sub-circuit is connected to the pull-down node; and
    the second pull-down node control sub-circuit is configured to control the pull-down control node to be connected to a first clock signal input end when the first clock signal input end inputs a first level, and control the pull-down node to be connected to the first clock signal input end when a potential of the pull-down control node is at the first level, so that the potential of the pull-down node is at a first level and a noise reduction transistor included in the noise reduction sub-circuit is turned off.

2. The shift register circuit according to claim 1, wherein the first pull-down node control sub-circuit is configured to control the potential of the pull-down control node and the potential of the pull-down node to be both at a second level when the first clock signal input end inputs a second level and the potential of the pull-up node is at a first level, to control the noise reduction transistor to be turned on;
    the first pull-down node control sub-circuit is further configured to control the potential of the pull-down control node to be at the first level when the first clock signal input end inputs a second level and the potential of the pull-up node is at a second level; and
    the second pull-down node control sub-circuit is further configured to control to disconnect the pull-down node and the first clock signal input end when the potential of the pull-down control node is at a second level.

3. The shift register circuit according to claim 2, wherein the second pull-down node control sub-circuit comprises a first pull-down control sub-circuit and a second pull-down control sub-circuit;
    the first pull-down control sub-circuit is connected to the first clock signal input end, and the first pull-down control sub-circuit is connected to the pull-down control node, the first pull-down control sub-circuit is configured to control the pull-down control node to be connected to the first clock signal input end when the first clock signal input end inputs the first level; and
    the second pull-down control sub-circuit is connected to the pull-down control node, the second pull-down control sub-circuit is connected to the first clock signal input end, the second pull-down control sub-circuit is connected to the pull-down node, and the second pull-down control sub-circuit is configured to control the pull-down node to be connected to the first clock signal input end when the potential of the pull-down control node is at a first level.

4. The shift register circuit according to claim 3, wherein the first pull-down control sub-circuit comprises a first pull-down control transistor, a gate electrode of the first pull-down control transistor is connected to the first clock signal input end, a first electrode of the first pull-down control transistor is connected to the pull-down control node, and a second electrode of the first pull-down control transistor is connected to the first clock signal input end.

5. The shift register circuit according to claim 4, wherein transistors included in the first pull-down node control sub-circuit are all n-type transistors, and the first pull-down control transistor is a p-type transistor.

6. The shift register circuit according to claim 4, wherein transistors included in the first pull-down node control sub-circuit are all p-type transistors, and the first pull-down control transistor is an n-type transistor.

7. The shift register circuit according to claim 3, wherein the second pull-down control sub-circuit comprises a second pull-down control transistor, a gate electrode of the second pull-down control transistor is connected to the pull-down control node, and a first electrode of the second pull-down control transistor is connected to the pull-down node, and a second electrode of the second pull-down control transistor is connected to the first clock signal input end.

8. The shift register circuit according to claim 7, wherein transistors included in the first pull-down node control sub-circuit are all n-type transistors, and the second pull-down control transistor is a p-type transistor.

9. The shift register circuit according to claim 7, wherein transistors included in the first pull-down node control sub-circuit are all p-type transistors, and the second pull-down control transistor is an n-type transistor.

10. The shift register circuit according to claim 2, wherein the noise reduction sub-circuit is further connected to the pull-up node, the noise reduction sub-circuit is further connected to a gate driving signal output end, and the noise reduction sub-circuit is further connected to the first voltage input end;
    the noise reduction sub-circuit is configured to control the pull-up node to be connected to the first voltage input end when the potential of the pull-down node is at a second level; control the gate driving signal output end to be connected to the first voltage input end, to reduce noise on the pull-up node and the gate driving signal output end; and the noise reduction sub-circuit is further configured to control to disconnect the pull-up node and the first voltage input end when the potential of the pull-down node is at a first level; and control to disconnect the gate driving signal output end and the first voltage input end.

11. The shift register circuit according to claim 10, wherein the noise reduction sub-circuit comprises a first noise reduction transistor and a second noise reduction transistor,
  a gate electrode of the first noise reduction transistor is connected to the pull-down node, a first electrode of the first noise reduction transistor is connected to the gate driving signal output end, and a second electrode of the first noise reduction transistor is connected to the first voltage input end;
  a gate electrode of the second noise reduction transistor is connected to the pull-down node, a first electrode of the second noise reduction transistor is connected to the pull-up node, and a second electrode of the second noise reduction transistor is connected to the first voltage input end;
  the first pull-down node control sub-circuit comprises a first pull-down control node control transistor, a second pull-down control node control transistor, a first pull-down node control transistor and a second pull-down node control transistor;
  a gate electrode of the first pull-down control node control transistor is connected to the first clock signal input end, a first electrode of the first pull-down control node control transistor is connected to the first clock signal input end and a second electrode of the first pull-down control node control transistor is connected to the pull-down control node;
  a gate electrode of the second pull-down control node control transistor is connected to the pull-up node, a first electrode of the second pull-down control node control transistor is connected to the pull-down control node, and a second electrode of the second pull-down control node control transistor is connected to the first voltage input end;
  a gate electrode of the first pull-down node control transistor is connected to the pull-down control node, a first electrode of the first pull-down node control transistor is connected to the first clock signal input end, and a second electrode of the first pull-down node control transistor is connected to the pull-down node; and
  a gate electrode of the second pull-down node control transistor is connected to the pull-up node, a first electrode of the second pull-down node control transistor is connected to the pull-down node, and a second electrode of the second pull-down node control transistor is connected to the first voltage input end.

12. The shift register circuit according to claim 1, further comprising a pull-up node control sub-circuit, a storage capacitor sub-circuit, an output pull-up sub-circuit and an output pull-down sub-circuit;
  the pull-up node control sub-circuit is connected to an input end, the pull-up node control sub-circuit is connected to the first clock signal input end, the pull-up node control sub-circuit is connected to a reset end, the pull-up node control sub-circuit is connected to the pull-up node, and the pull-up node control sub-circuit is connected to the first voltage input end; and the pull-up node control sub-circuit is configured to control the potential of the pull-up node under the control of the input end, the first clock signal input end and the reset end;
  a first end of the storage capacitor sub-circuit is connected to the pull-up node, and a second end of the storage capacitor sub-circuit is connected to a gate driving signal output end;
  the output pull-up sub-circuit is connected to the pull-up node, the output pull-up sub-circuit is connected to the gate driving signal output end, and the output pull-up sub-circuit is connected to a second clock signal input end; and the output pull-up sub-circuit is configured to control to connect or disconnect the gate driving signal output end and the second clock signal input end under the control of the pull-up node; and
  the output pull-down sub-circuit is connected to the reset end, the output pull-down sub-circuit is connected to the first clock signal input end, the output pull-down sub-circuit is connected to the first voltage input end, and the output pull-down sub-circuit is connected to the gate driving signal output end; and the output pull-down sub-circuit is configured to control the potential of the gate driving signal outputted by the gate driving signal output end under the control of the reset end and the first clock signal input end.

13. A method for driving the shift register circuit according to claim 1, comprising:
  when a first clock signal input end inputs a first level, controlling, by a second pull-down node control sub-circuit, a pull-down control node to be connected to the first clock signal input end; and
  when a potential of the pull-down control node is at a first level, controlling, by the second pull-down node control sub-circuit, the pull-down node to be connected to the first clock signal input end, to control the potential of the pull-down node to be at the first level, and a noise reduction transistor included in a noise reduction sub-circuit to be turned off.

14. The method according to claim 13, further comprising:
  when the first clock signal input end inputs a second level and a potential of the pull-up node is at the first level, controlling, by a first pull-down node control sub-circuit, the potential of the pull-down control node and the potential of the pull-down node to be at a second level, to control the noise reduction transistor to be turned on;
  when the first clock signal input end inputs the second level and the potential of the pull-up node is at the second level, controlling, by the first pull-down node control sub-circuit, the potential of the pull-down control node to be at the first level; and
  when the potential of the pull-down control node is at the second level, controlling, by the second pull-down node control sub-circuit, to disconnect the pull-down node and the first clock signal input end.

15. The method according to claim 14, comprising, within a display period, an input step, an output step, a noise reduction step, and a threshold voltage correction step, wherein
  in the input step, the first clock signal input end inputs the second level, and the potential of the pull-up node is at the second level, and a first pull-down node control sub-circuit controls the potential of the pull-down control node to be at the first level, and a second pull-down node control sub-circuit controls the pull-down node to be connected to the first clock signal input end, the potential of the pull-down node to be at the first level, and the noise reduction transistor to be turned off;

in the output step, the first clock signal input end inputs the first level, the potential of the pull-up node is at the second level, and the second pull-down node control sub-circuit controls the pull-down control node to be connected to the first clock signal input end, the potential of the pull-down control node to be at a first level, and the second pull-down node control sub-circuit controls the pull-down node to be connected to the first clock signal input end, the potential of the pull-down node to be at a first level, and the noise reduction transistor to be turned off;

in the noise reduction step, the first clock signal input end inputs the second level, the potential of the pull-up node is at the first level, and the first pull-down node control sub-circuit controls the potential of the pull-down control node to be at the second level, and the second pull-down node control sub-circuit controls to disconnect the pull-down node and the first clock signal input end, the first pull-down node control sub-circuit controls the potential of the pull-down node to be at a second level, the noise reduction transistor to be turned on; and in the threshold voltage correction step, the first clock signal input end inputs the first level, the potential of the pull-up node is at the first level, and the second pull-down node control sub-circuit controls the pull-down control node to be connected to the first clock signal input end, the potential of the pull-down control node to be at the first level, and the second pull-down node control sub-circuit controls the pull-down node to be connected to the first clock signal input end, the potential of the pull-down node to be at the first level, and the noise reduction transistor to be turned off.

16. The method according to claim 15, further comprising:

repeatedly performing the noise reduction step and the threshold voltage correction step within the display period until an adjacent next display period begins.

17. A display device, comprising the shift register circuit according to claim 1.

* * * * *